United States Patent
Wallace et al.

[11] Patent Number: 6,140,243
[45] Date of Patent: Oct. 31, 2000

[54] LOW TEMPERATURE PROCESS FOR POST-ETCH DEFLUORIDATION OF METALS

[75] Inventors: Robert M. Wallace, Richardson; Peijun Chen, Dallas; S. Charles Baber, Richardson; Steven A. Henck, Plano, all of Tex.

[73] Assignee: Texas Instruments Incorporated, Dallas, Tex.

[21] Appl. No.: 08/988,570

[22] Filed: Dec. 11, 1997

Related U.S. Application Data

[60] Provisional application No. 60/035,270, Dec. 12, 1996.

[51] Int. Cl.[7] .................................................. H01L 21/311
[52] U.S. Cl. ........................... 438/700; 438/709; 438/710; 438/720; 438/745; 438/754
[58] Field of Search ..................... 438/700, 709, 438/710, 720, 745, 754

[56] References Cited

U.S. PATENT DOCUMENTS

| | | |
|---|---|---|
| 4,430,152 | 2/1984 | Okano ...................................... 156/643 |
| 5,700,740 | 12/1997 | Chen et al. ............................... 438/710 |

FOREIGN PATENT DOCUMENTS

| | | | |
|---|---|---|---|
| 0 596 364 A2 | 5/1994 | European Pat. Off. | ........ H01L 21/94 |
| 0 680 078 A2 | 11/1995 | European Pat. Off. | ...... H01L 21/311 |
| WO 93/17453 | 9/1993 | WIPO | .......... H01L 21/306 |
| WO 95/21458 | 8/1995 | WIPO | .......... H01L 21/321 |

OTHER PUBLICATIONS

Pearson, et al.; Low bias dry etching of tungsten and dielectric layers on GaAs; Semiconductor Science and Technology, vol. 8, No. 10, Oct. 1, 1993 pp. 1897–1903; XP000417423.

*Primary Examiner*—Benjamin L. Utech
*Assistant Examiner*—Vanessa Pérez-Ramos
*Attorney, Agent, or Firm*—Mark A. Valetti; Wade James Brady, III; Frederick J. Telecky, Jr.

[57] ABSTRACT

An integrated circuit fabrication process in which residual fluorine contamination on metal surfaces after ashing is removed by exposure to an $NH_3/O_2$ plasma.

15 Claims, 7 Drawing Sheets

LOW TEMPERATURE PROCESS FOR POST-ETCH DEFLUORIDATION OF METALS

This is a Non Provisional application filed under 35 USC 119(e) and claims priority of prior provisional, Ser. No. 60/035,270 of inventor Robert M. Wallace, et al, filed Dec. 12, 1996.

BACKGROUND AND SUMMARY OF THE INVENTION

The present invention relates to integrated circuit fabrication processes, and specifically to post-etch cleanup procedures.

In integrated circuit fabrication, a wide variety of chemistries are used for etching thin layers. Among the most versatile (and strongest) chemistries are fluorine-based chemistries. Such chemistries are used for oxide etching, for tungsten etching, and (in combination with an oxygen source) for photoresist removal (commonly referred to as "ashing"). However, fluorine-based chemistries tend to leave some fluorine contamination.

The present inventors have discovered that residual fluorine contamination in metal layers is a cause of reduced adhesion, higher contact resistance, and diminished nucleation of subsequently deposited layers. Specifically, the adhesion and electrical contact problems of aluminum which has been exposed to an ashing process are due to formation of metal fluorides and/or oxyfluorides. Furthermore, aluminum in thin films forms a thin but durable native oxide (which is primarily $Al_2O_3$) on exposure to air, so that the material self-passivates; but the presence of fluorine contaminants produces a lower density passivation layer, so the self-passivation is not as good. Thus, residual fluorine contamination is a serious problem.

Innovative Processes

The present application discloses a new process which removes this fluoride surface contamination, and leaves a more tractable metal oxide layer. This is accomplished by exposure of the fluorine-contaminated surface to $NH_3$ (or other amine chemistry).

Thus the disclosed inventions provide at least the following advantages:

increased adhesion;

lower contact resistance;

better nucleation of subsequent layers, with resulting greater smoothness and modified surface surface chemistry;

better metal self-passivation;

improved corrosion resistance;

improved long term chemical stability; and ashing processes can continue to use an admixture of fluorine with the oxygen chemistry.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

In order to eliminate the adhesion problems associated with the presence of fluorine contaminants, a process for the low temperature removal of fluorides and oxyfluorides, produced from fluorine-laden plasma processes, such as that produced by a long undercut process in a micromechanical process, from metal-oxide surfaces is preferably used. Removal of fluorine from, for example, electrode surfaces permits the formation of a higher density passivation layer, since more bonding sites for passivants become available due to the absence of the fluorine. Metal fluorides and oxyfluorides are known to be more volatile compared to their oxides and are more prone to corrosion attack. Aluminum fluoride is also a stronger Lewis acid (and hence less inert) than aluminum oxide. The removal of fluorine improves the long term chemical stability of such surfaces and reduces their reactivity.

Overview of Process

Figure 1:
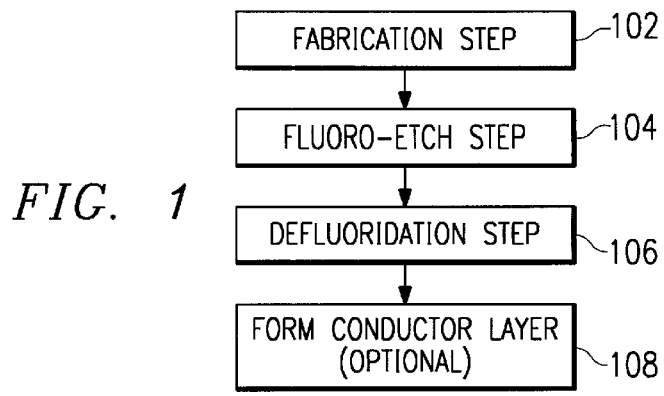
FIG. 1 is a flow chart showing steps in a sample process embodiment.
Figure 2A:
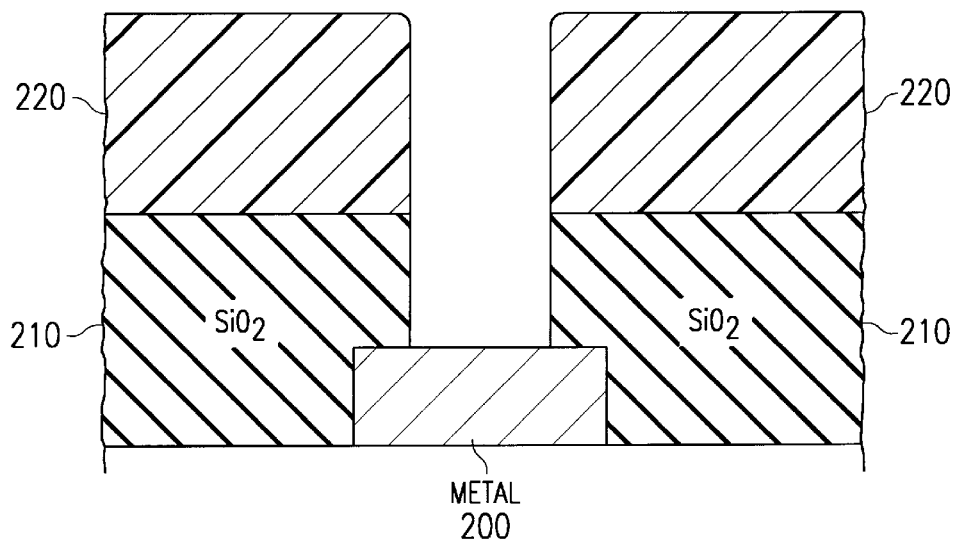
FIGS. 2A and 2B show a sample metal structure to which the disclosed defluoridation treatments can advantageously be applied.
Figure 2B:
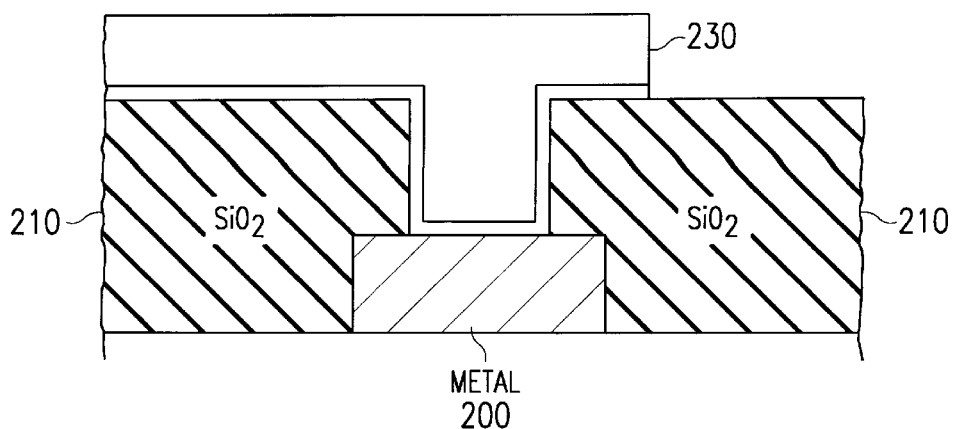

FIG. 1 is a flow chart showing steps in a sample process embodiment, and FIGS. 2A and 2B show a sample metal structure to which the disclosed defluoridation treatments can advantageously be applied.

In FIG. 1, step 102 shows fabrication steps before the fluoro-etch. In the sample implementation of FIG. 2A, this would include formation of an underlying metal layer 200, typically aluminum, formation of a dielectric layer 210 (e.g. $SiO_2$), and formation and patterning of a photoresist layer 220.

Step 104 shows the fluoro-etch step. In the sample implementation of FIG. 2A, this would include etching of the $SiO_2$ 210 through the mask of photoresist layer 220, followed by removal of the photoresist layer 220, by a remotely excited $NF_3/O_2$ plasma in a Gasonics™ asher.

Step 106 shows the defluoridation step, performed by one of the various embodiments detailed below.

Step 108 shows the optional subsequent step of forming an overlying barrier/adhesion layer 225, and conductor layer 230, as can be seen in FIG. 2B. Due to the defluoridation performed by step 106, this subsequent step will achieve better adhesion, lower contact resistance, and/or better nucleation (and hence smoothness) of subsequently deposited layers.

Sample Embodiment: Aluminum Defluoridation with NH$_3$-bearing Gas Stream

A sample embodiment demonstrates the use of an NH$_3$ plasma generated in a RIE plasma reactor at room temperature to remove the fluorides and oxyfluorides from AlO$_x$F$_y$ surfaces. These fluorine-laden surfaces are generated by an NF$_3$/O$_2$ ashing process.

The following tables give results from actual fluorine removal test runs utilizing sample embodiments of the innovative process described herein. The table below shows a preferred embodiment of the innovative method of the present application where an NH$_3$/O$_2$ plasma is used. (The use of an oxidizing component helps to convert the oxyfluorides to oxides.) Flow was not directly regulated, but a mechanical pump was used to roughly regulate the total pressure. (This procedure was performed in a Technics MicroRIE-800 etcher.)

| Starting Material: | AlO$_x$F$_y$ |
|---|---|
| Gas ratio: | NH$_3$/O$_2$ 1:1 |
| Total pressure: | 600 mTorr |
| RF power: | 70 W |
| Time: | 10 min |

Figure 6A:
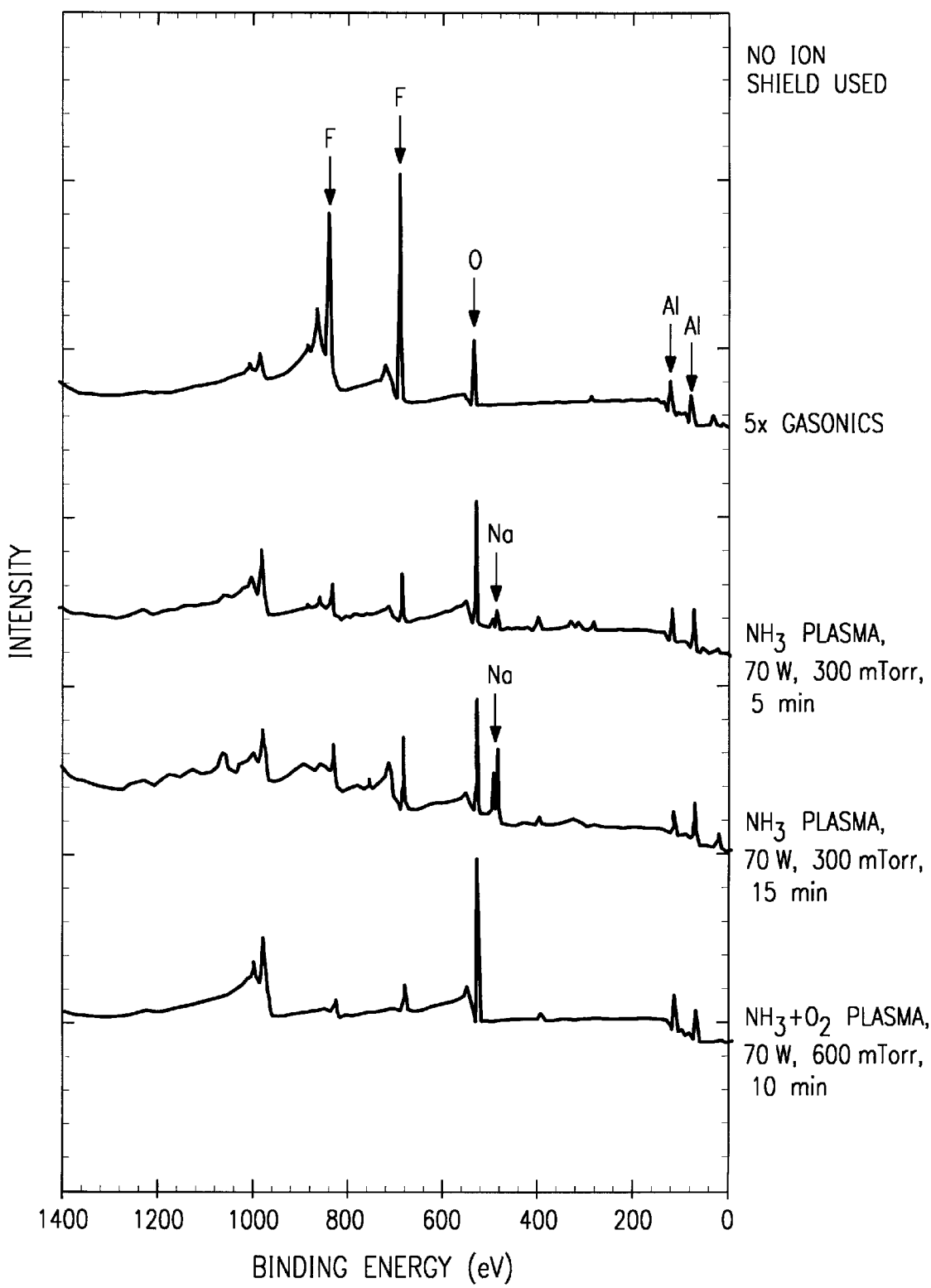
FIGS. 6A–6D are characterization results which demonstrate how the disclosed process operates.

Surface fluorine concentration was markedly reduced, and surface oxygen concentration was increased, as shown by the fourth (bottom) trace in FIG. 6A.

The following tables demonstrate less preferred embodiments utilizing only an NH$_3$ plasma.

| Starting Material: | AlO$_x$F$_y$ |
|---|---|
| Total pressure: | 300 mTorr |
| RF power: | 70 W |
| Time: | 15 min |

Again, surface fluorine concentration was markedly reduced, as shown by the third trace in FIG. 6A.

Note that in the table shown below, the surface was exposed to an NH$_3$ plasma for only one-third of the time used in the preceding run. Nevertheless, the fluorine concentration was greatly reduced, as shown in the second curve of FIG. 6A.

| Starting Material: | AlO$_x$F$_y$ |
|---|---|
| Total pressure: | 300 mTorr |
| RF power: | 70 W |
| Time: | 5 min |

Sample Embodiment: Al Defluoridation with Aqueous NH$_4$OH

In another sample embodiment, defluoridation of the surface was accomplished using an aqueous NH$_4$OH solution (or vapor). As detailed in the experimental results below, this process has been found to achieve successful defluoridation of the aluminum surface.

Alternative Embodiment: Al Defluoridation with Non-Aqueous Liquid Reagent

In another sample embodiment, defluoridation of the surface was accomplished using a non-aqueous liquid (1% wt. of tetramethylammonium hydroxide in ultrapure methanol). This process too has been found to achieve successful defluoridation of the aluminum surface.

Alternative Embodiment: Atomic Hydrogen

In this contemplated alternative embodiment, a mixture of atomic hydrogen and activated H$_2$ (as afterglow from a microwave excitation stage) is used, instead of an amine chemistry, as the fluorine scavenger.

Alternative Embodiment: N$_2$O

In this sample alternative embodiment, N$_2$O is used rather than O$_2$, in combination with NH$_3$ or another fluorine scavenger, as an oxidizing component. Other processing conditions remain substantially the same.

Alternative Embodiment: H$_2$O

In this sample alternative embodiment, H$_2$O is used rather than O$_2$, in combination with NH$_3$ or another fluorine scavenger, as an oxidizing component. Other processing conditions remain substantially the same.

Alternative Embodiment: Ozone

In this sample alternative embodiment, O$_3$ is used rather than O$_2$, in combination with NH$_3$ or another fluorine scavenger, as an oxidizing component. Other processing conditions remain substantially the same.

Alternative Embodiment: Via Treatment

Figure 3:
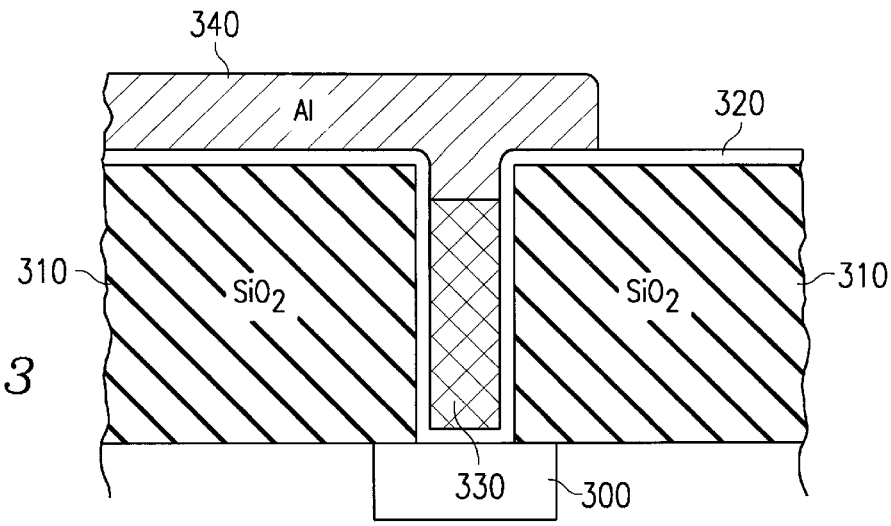
FIG. 3 shows a sample via structure to which the disclosed defluoridation treatments can advantageously be applied.

For example, the innovative processes disclosed herein are applicable to defluoridation of conductor surfaces after a tungsten etchback step. (Tungsten etchback normally uses a fluorine-based chemistry.) FIG. 3 shows a sample implementation of a via structure using the innovative treatment process of the present invention.

In this embodiment, an interlevel dielectric layer 310 (typically SiO$_2$) is deposited over an underlying metal layer 300 (typically aluminum). Thereafter, the dielectric layer is patterned using a photoresist layer and etched, using a fluoro-etch, to form holes where vias are desired (i.e. where an electrical contact to the underlying metal layer 300 is desired). This etching step leaves residual fluorine on the surface of the underlying metal, which can then be removed using one of the defluoridation processes described above. A diffusion barrier layer 320, such as titanium nitride, can then optionally be deposited to line the walls of the vias before depositing metal 330 (tungsten in this example) overall. Global etchback then leaves the tungsten as plugs. Additional metal layers 340 can be deposited and etched.

Alternative Embodiment: Undercutting

Figure 4A:
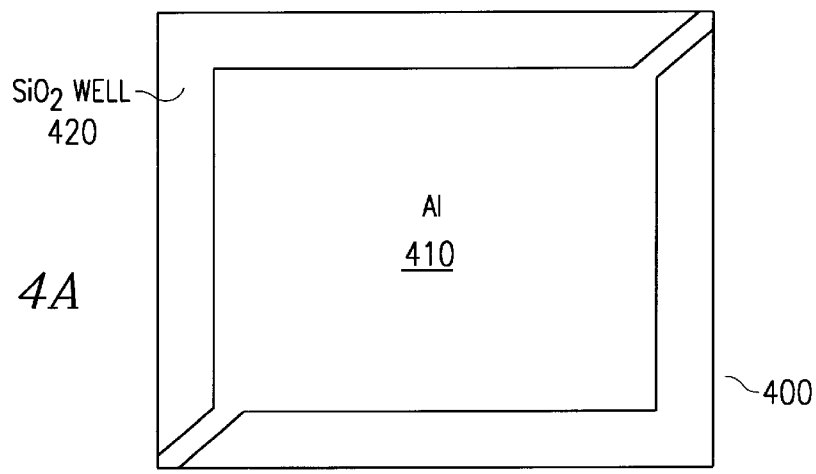
FIGS. 4A–4C show a sample micromechanical structure to which the disclosed defluoridation treatments can advantageously be applied.
Figure 4B:
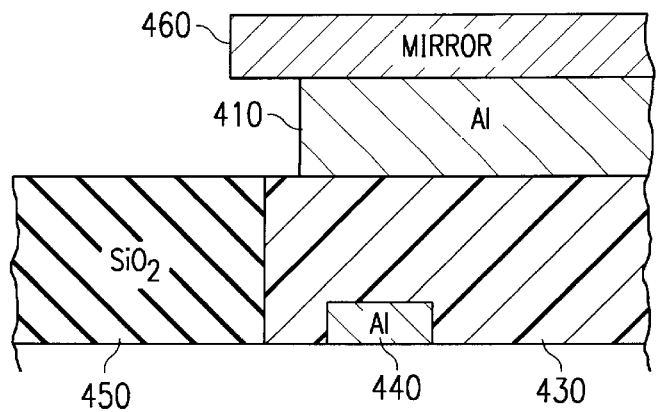
Figure 4C:
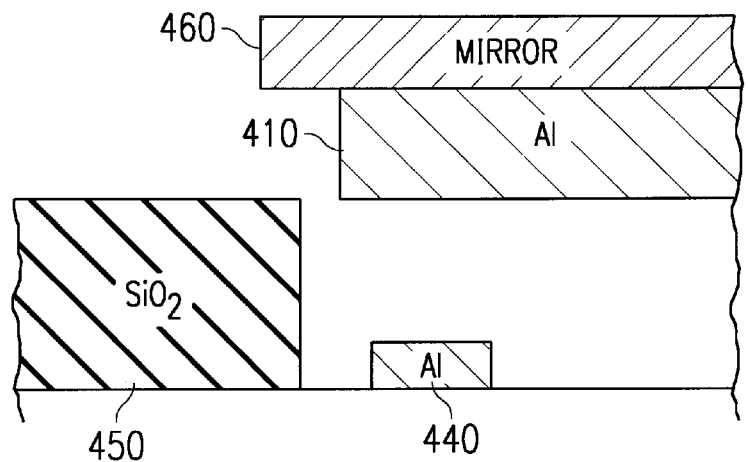

FIGS. 4A–4C show another sample structure to which the disclosed defluoridation treatments can advantageously be applied. In this alternative embodiment, an optical modulator cell 400 includes a plate of aluminum 410 is suspended over a well 420 of a dielectric material, such as SiO$_2$, as shown in the plan view of FIG. 4A.

At an intermediate stage of fabrication, this plate 410 overlies a layer of photoresist 430, which has been deposited over well bottom 420. FIG. 4B illustrates this configuration. An interlevel dielectric layer 450 is shown adjacent to the photoresist layer, and a layer of mirror material 460 rests on top of the plate 410. The photoresist layer 430 is subsequently removed, by an isotropic oxyfluorine undercut process (similar to an ashing process), leaving the micromechanical structure shown in FIG. 4C. This step also leaves residual fluorine on the surface of the metal 410 and 440. This can cause problems, as discussed above. In order to obviate these problems, the residual fluorine is then removed using one of the innovative defluoridation processes described above.

Alternative Embodiment: Ashing

Integrated circuit fabrication processes use many photoresist patterning steps at various stages, and photoresist patterning steps are normally followed by an "ashing" step to remove the photoresist. The ashing step uses an oxygen plasma to volatize the organic components of the photoresist, but also normally includes some admixture of fluorine to volatize the unavoidable fraction of inorganics (the "ash").

Figure 5:
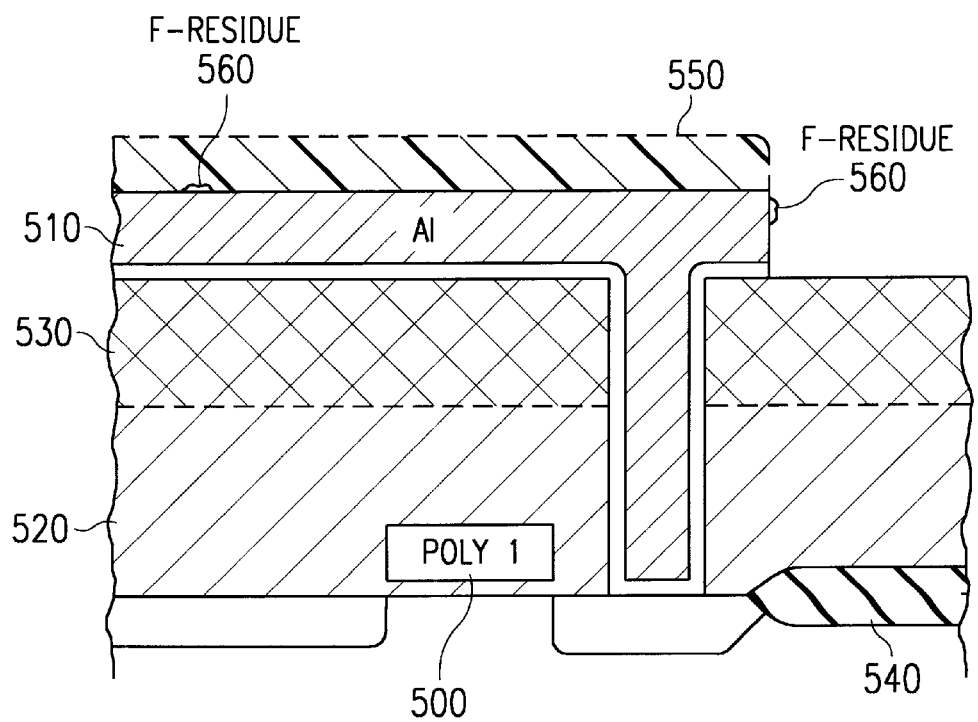
FIG. 5 shows a sample metal structure utilizing an ashing step to which the disclosed defluoridation treatments can advantageously be applied.

Thus, any ashing step tends to introduce superficial fluoridation (at least on surfaces which form a nonvolatile fluoride or oxyfluoride). For example, in FIG. 5, a metal structure is shown consisting of a transistor 500 contacted by a metal layer 510, such as aluminum. An interlevel dielectric layer 530 overlies the transistor. Preferably, the layer 530 comprises BPSG/TEOS. Also shown is a LOCOS oxide 540. The metal layer can be patterned and etched using a photoresist 550 followed by an ashing step to remove the photoresist 550. The ashing step will leave some residual fluorine 560 on the surface of the metal layer 510. Therefore, the disclosed defluoridation chemistries can also be used in this context to remove the residual fluorine to provide improved adhesion for subsequently deposited layers.

Characterization Results

FIGS. 6A–6D show X-ray Photoelectron Spectroscopy (XPS) measurements which demonstrate how the surface fluorine concentration is affected by the steps described above.

The effectiveness of an $NH_3$ plasma treatment is shown in FIG. 6A. Again, evidence for the removal of fluorine (present as aluminum oxyfluoride and aluminum fluoride) and the increase in oxygen (present as aluminum oxide) is clearly evident. Some contamination (mainly Na) is observed and is attributed to contamination of the reactor walls. The use of an $NH_3/O_2$ plasma was shown to be very effective at fluorine removal and oxide formation, as is also seen in FIG. 6A.

The top trace in FIG. 6A shows the high levels of fluorine on the surface of the aluminum after five passes through the Gasonics asher. The second, third, and fourth traces show the effect of the plasma defluoridation processes described above; note how the height of the fluorine peaks is reduced, and that of the oxygen peaks is increased.

Figure 6B:
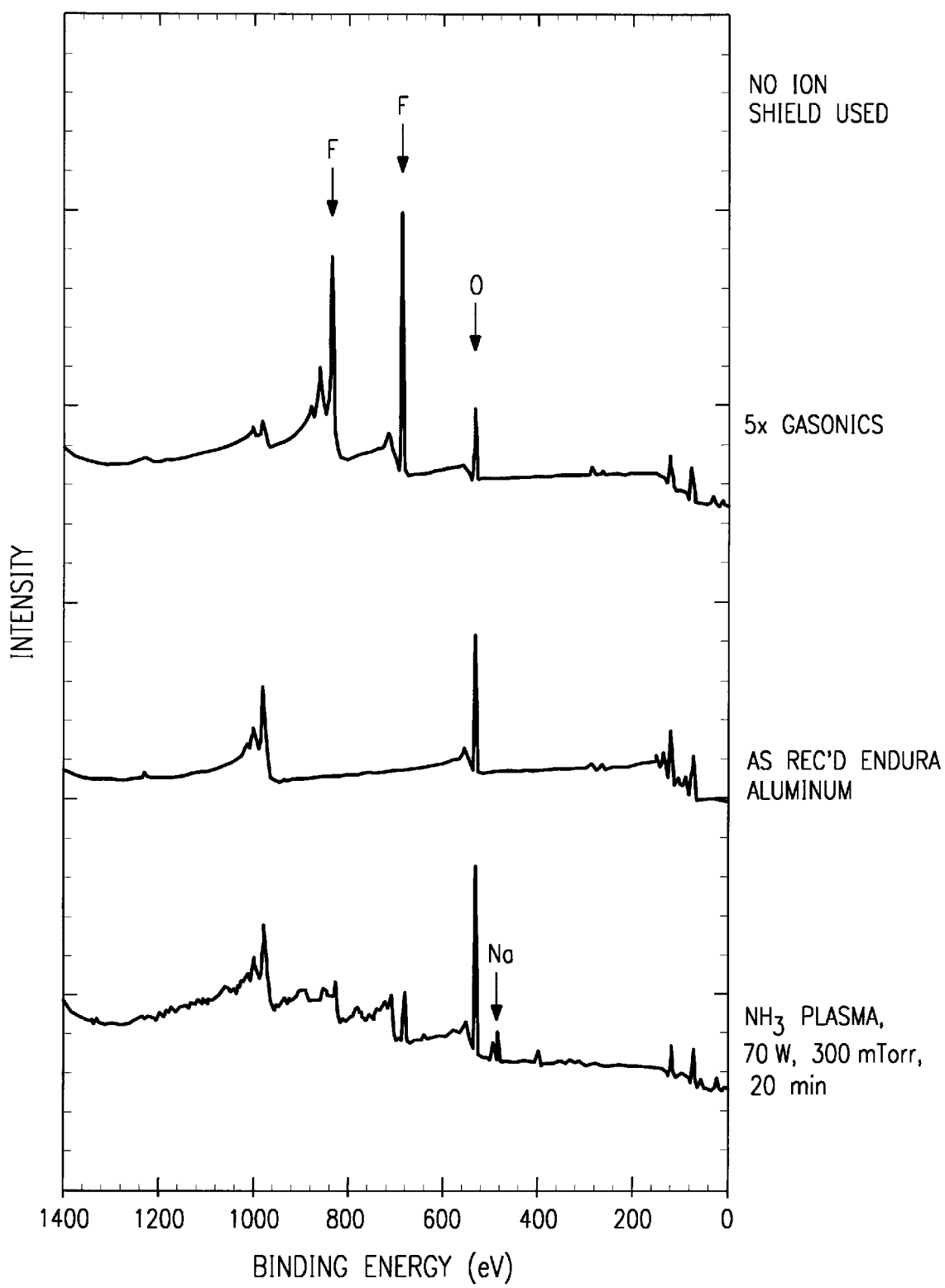
Figure 6C:
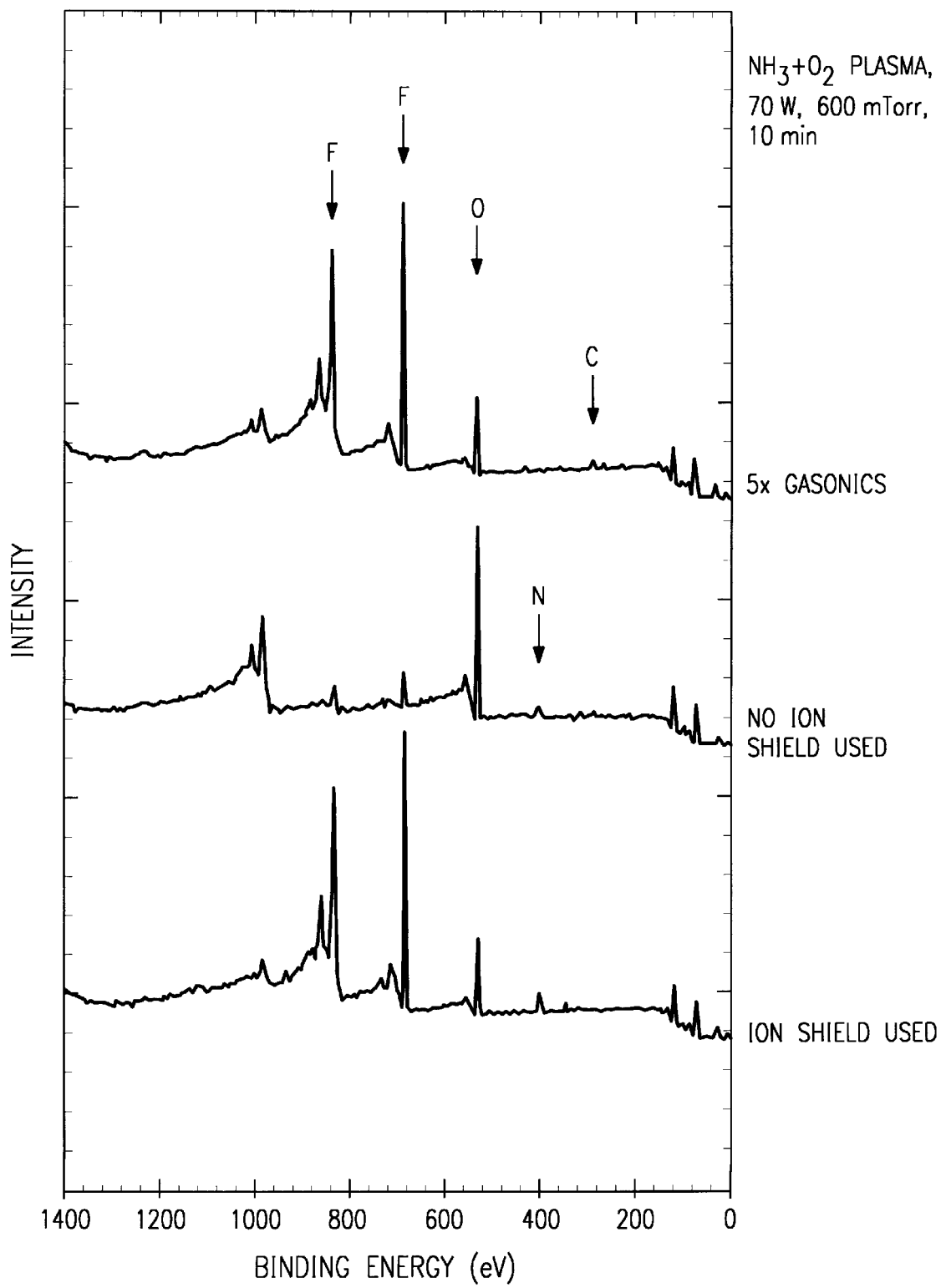

Residual fluorine present in the reactor can result in a lower limit in the removal of fluorine from the surface. This effect is shown in FIG. 6B, where it can be seen that the fluorine lines after defluoridation are still higher than those in as-received aluminum. As shown by the small peak marked Na, some sodium contamination was also observed.

The importance of ions in the process was examined by using a screen placed over a fluorinated sample. (Under these conditions the screen served as an "ion shield".) Without such a shield, fluorine removal is observed, as indicated in the second trace of FIG. 6C for the $NH_3/O_2$ process. When the shield is in place, little or no removal occurs, as shown in the third trace of FIG. 6C. These results suggest that ions present in the plasma are important for effective de-fluorination of the surface.

Figure 6D:
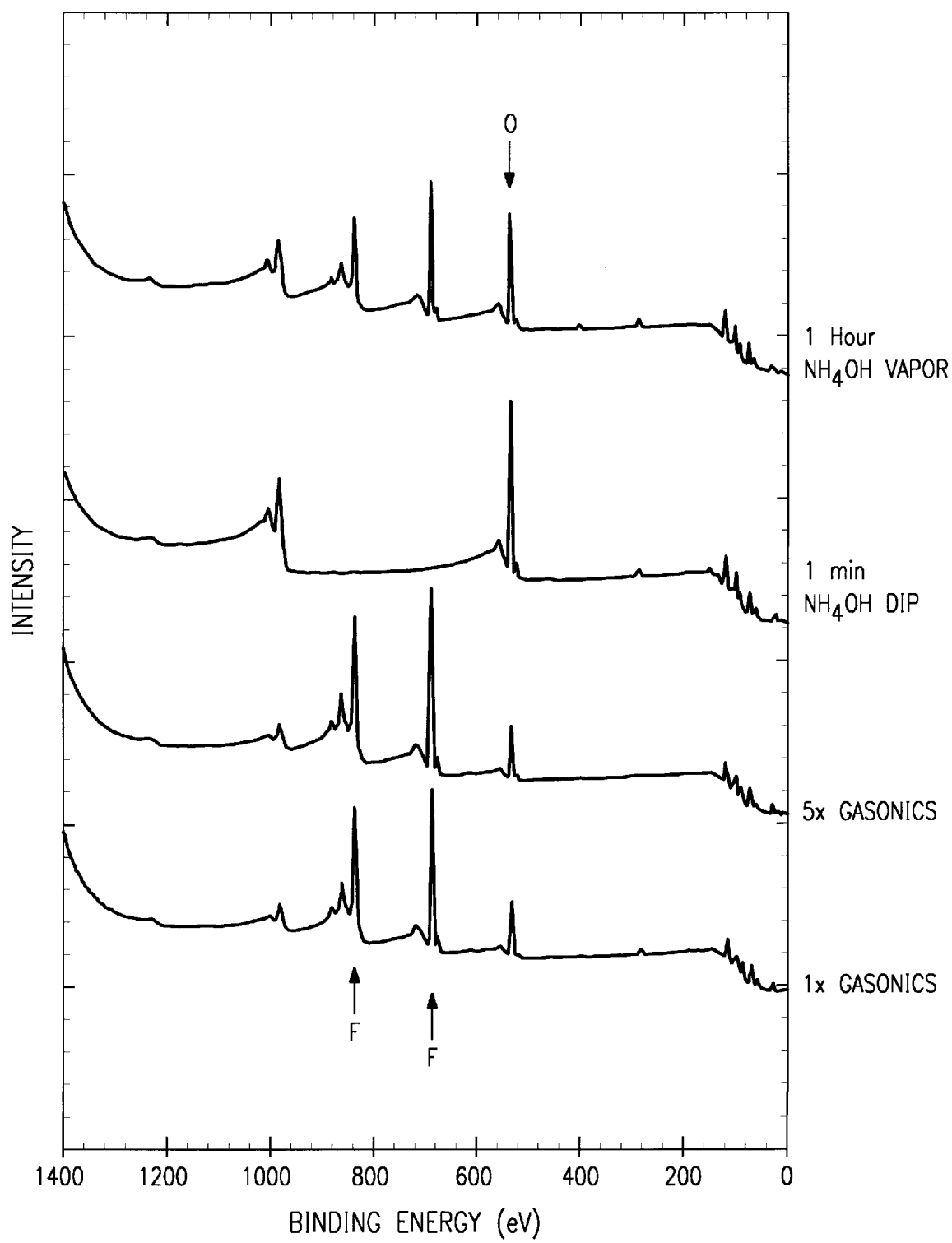

FIG. 6D shows two further points. As the bottom two traces show, the surface fluorine contamination appears to saturate after just one pass through an $NF_3/O_2$ remote plasma generated in a Gasonics etcher, with no significant increase seen after four further passes through this process.

FIG. 6D also shows the effectiveness of defluoridation in aqueous $NH_4OH$ solution. Exposing a fluorine-contaminated surface to an aqueous $NH_4OH$ solution for 1 min results in the removal of fluorine from the surface and a concomitant increase in aluminum oxide formation. The surface produced by this process also appears to reflect light in a specular manner, indicating that the surface roughness can be controlled. Note that exposure to $NH_4OH$ vapor for one hour achieved some fluorine reduction, but was far less effective.

According to a disclosed class of innovative embodiments, there is provided: A defluoridation process, comprising the steps of: (a.) providing a layer of conductive material having fluorides and/or oxyfluorides on the surface thereof; and (b.) after said step (a.), removing said fluorides and said oxyfluorides from the surface of said layer of conductive material, using a fluorine-scavenging chemistry; whereby improved adhesion for subsequently deposited layers is achieved.

According to another disclosed class of innovative embodiments, there is provided: A defluoridation process for fabricating integrated circuit structures, comprising the steps of: (a.) forming a layer of conductive material; (b.) performing an etching step which leaves residual fluorine on the surface of said layer of conductive material; and (c.) after said step (b.), removing said residual fluorine with an amine chemistry; whereby improved adhesion for subsequently deposited layers is achieved.

According to another disclosed class of innovative embodiments, there is provided: An integrated circuit fabrication process, comprising the steps of: (a) forming underlying structures; (b.) forming at least one interlevel dielectric layer over said underlying structures; (c.) patterning and etching said dielectric layer to form holes in contact locations, wherein said step of etching leaves residual fluorine on the surface of said dielectric layer and said underlying structures; and (d.) after said step (c.), removing said residual fluorine by reacting with a plasma-activated fluorine-scavenging chemistry; whereby improved adhesion for subsequently deposited layers is achieved.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

The defluoridation reagent is preferably in the vapor phase, but can alternatively be in the liquid or supercritical phase.

Alternatively and less preferably, the disclosed chemistries can also be applied to other metals which have been exposed to a fluorine-bearing gas flow, if the metal oxide is more tractable than a metal oxyfluoride.

Of course, the specific etch chemistries, layer compositions, and layer thicknesses given are merely illustrative, and do not by any means delimit the scope of the claimed inventions.

Some additional background, which shows the knowledge of those skilled in the art regarding process modifications and implementations, may be found in the following books: Anner, PLANAR PROCESSING PRIMER (1990); BICMOS TECHNOLOGY AND APPLICATIONS (ed. Alvarez 1989); Brodie and Muray, PHYSICS OF MICROFABRICATION (1982); Castellano, SEMICONDUCTOR DEVICE PROCESSING; TECHNOLOGY TRENDS IN THE VLSI ERA (1991); Chen, CMOS DEVICES AND TECHNOLOGY FOR VLSI; Cooper and Weisbecker, SOLID STATE DEVICES AND INTEGRATED CIRCUITS (1982); Dillinger, VLSI ENGINEERING (1988); DRY ETCHING FOR VLSI (ed. van Roosmalen et al. 1991); Einspruch et al., LITHOGRAPHY FOR VLSI (1987); El-Kareh et al., INTRODUCTION TO VLSI SILICON DEVICES (1986); Elliott, INTEGRATED CIRCUIT MASK TECHNOLOGY (1985); Elliott, LNTEGRATED CIRCUIT FABRICATION TECHNOLOGY (ca. 1983, and 2.ed. 1989); ENCYCLOPEDIA OF SEMICONDUCTOR TECHNOLOGY (ed. Grayson 1984); Ferry et al., ULTRA LARGE SCALE INTEGRATED MICROELECTRONICS (1988); Gise and Blanchard, MODERN SEMICONDUCTOR FABRICATION TECHNOLOGY (1986); HANDBOOK OF SEMICONDUCTOR TECHNOLOGY (ed. O'Mara et al. 1990); HANDBOOK OF THIN FILM PROCESS TECHNOLOGY (Institute of Physics; annual editions); HANDBOOK OF VLSI MICROLITHOGRAPHY; PRINCIPLES, TECHNOLOGY, AND APPLICATIONS (ed. Glendinning and Helbert 1991); Knights, PHYSICS OF VLSI (1984); Kooi, INVENTION OF LOCOS (1991); LPCVD SILICON NITRIDE AND OXYNITRIDE FILMS (ed.Habraken); Maly, ATLAS OF INTEGRATED CIRCUIT TECHNOLOGIES (ca. 1985); MICROELECTRONICS PROCESSING (ed. Jensen); Milnes, SEMICONDUCTOR DEVICES AND INTEGRATED ELECTRONICS (1980); Muller & Kamins, DEVICE ELECTRONICS FOR INTEGRATED CIRCUITS (1977, 2.ed. 1986); Nashelsky and Boylestad, DEVICES, DISCRETE AND INTEGRATED (1981); Nicollian and Brews, MOS PHYSICS AND TECHNOLOGY (ca.1983); PHYSICS AND FABRICATION OF MICROSTRUCTURES AND MICRODEVICES (ed. Kelly et al. 1986); Pierret, FIELD EFFECT DEVICES (1983 and 2.ed. 1990); Pimbley et al., ADVANCED CMOS PROCESS TECHNOLOGY (1989); PLASMA ETCHING (ed. Manos and Flamm 1989); PLASMA PROCESSING (ed. Dieleman et al. 1982); POWER INTEGRATED CIRCUITS; PHYSICS, DESIGN, AND APPLICATIONS (ed. Antognetti 1986); Prince, SEMICONDUCTOR MEMORIES: DESIGN, MANUFACTURE (2.ed. 1991); QUICK REFERENCE MANUAL FOR SI INTEGRATED CIRCUIT TECH (Beadle, Tsai, and Plummer); SEMICONDUCTOR TECHNOLOGY HANDBOOK (ed. Trapp et al., 1st through 6th editions); Rao, MULTILEVEL INTERCONNECT TECHNOLOGY (ca.1993); Runyan and Bean, SEMICONDUCTOR INTEGRATED CIRCUIT PROCESSING TECHNOLOGY (1990); Sedra and Smith, MICROELECTRONIC CIRCUITS (3rd ed. 1991); Schmitz, CVD OF TUNGSTEN AND TUNGSTEN SILICIDES FOR VLSI/ULSI APPLICATIONS (1992); SEMICONDUCTOR PROCESSING (ed.Gupta 1984); Stern, FUNDAMENTALS OF INTEGRATED CIRCUITS; Streetman, SOLID STATE ELECTRONIC DEVICES (2.ed. 1980, and 3.ed. 1990); Sze, PHYSICS OF SEMICONDUCTOR DEVICES (1969, and 2.ed. 1981); Sze, SEMICONDUCTOR DEVICES: PHYSICS AND TECHNOLOGY (1985); SURFACE AND INTERFACE EFFECTS IN VLSI (ed. Einspruch and Bauer); Talley, INTRODUCTION TO SEMICONDUCTOR DEVICE TECHNOLOGY (2.ed. 1984); THIN FLM PROCESSES I & II (ed. Vossen and Kern); Troutman, LATCHUP IN CMOS TECHNOLOGY (1986); TUNGSTEN AND OTHER REFRACTORY METALS FOR VLSI APPLICATIONS (ed. Wells 1988); ULTRA-FAST SILICON BIPOLAR TECHNOLOGY (ed. Treitinger et al. 1988); VERY LARGE SCALE IN-TEGRATION (ed. Barbe; 1980 and 2.ed. 1982); VLSI FABRICATION PRINCIPLES (1983); VLSI HANDBOOK (Einspruch 1985); VLSI METALLIZATION (ed. Einspruch, Cohen, and Gildenblat); VLSI TECHNOLOGIES THROUGH THE 80S AND BEYOND (ed. McGreivy and Pickar 1982); VLSI TECHNOLOGY AND DESIGN (ed. McCanny and White); VLSI TECHNOLOGY (ed.Sze; 1983 and 2.ed. 1988); VLSI: TECHNOLOGY AND DESIGN (ed. Folberth and Grobmann); Wang, INTRODUCTION TO SOLID STATE ELECTRONICS; Wolf, SLICON PROCESSING FOR THE VLSI ERA, vols. 1–3 (1985–1995); Zambuto, SEMICONDUCTOR DEVICES (1989); Zorich, HANDBOOK OF QUALITY INTEGRATED CIRCUIT MANUFACTURING; and the annual proceedings of the IEDM and VLSI Technology symposia for the years from 1980 to date.

What is claimed is:

1. A defluoridation process, comprising the steps of:

(a.) providing a layer of electrically conductive metallic material having fluorides and/or oxyfluorides on the surface thereof; and (b.) removing said fluorides and/or oxyfluorides from said surface of said layer of electrically conductive material to improve adhesion for layers subsequently deposited on said metallic material.

2. The process of claim 1, further comprising the step of, after said step of removing, depositing a conductor layer overlying said surface.

3. The process of claim 1, wherein said step of removing uses an $NH_3$ plasma.

4. The process of claim 1, wherein said step of removing uses $NH_4OH$ wet chemistry.

5. The process of claim 1, wherein said layer of conductive material comprises aluminum.

6. A defluoridation process for fabricating integrated circuit structures, comprising the steps of:

(a.) providing a layer of electrically conductive material having a surface;

(b.) performing an etching step which leaves residual fluoride and/or oxyfluorides on the surface of said layer of electrically conductive material; and (c.) removing said residual fluoride and/or oxyfluoride with an amine-containing fluoride and/or oxyfluoride scavenger material to provide improved adhesion for layers subsequently deposited on said surface.

7. The process of claim 6, further comprising the step, after said step of removing, depositing conductor layer overlying said surface.

8. The process of claim 6, wherein said step of removing uses a plasma-activated an amine-containing fluoride and/or oxyfluoride scavenger material.

9. The process of claim 6, wherein said step of removing uses $NH_4OH$ wet chemistry.

10. The process of claim 6, wherein said step of removing uses as non-aqueous amine wet chemistry.

11. The process of claim 6, wherein said step of removing is performed at room temperature.

12. The process of claim 6, wherein said etching step is an oxyfluorine ashing process which removes photoresist.

13. An integrated circuit fabrication process, comprising the steps of:
   (a.) forming an underlying structure;
   (b.) forming at least one interlevel dielectric layer over said underlying structure having a surface;
   (c.) patterning and etching said dielectric layer to form holes in contact locations, leaving residual fluorides and/or oxyfluorides on the surface of said dielectric layer and said underlying structure; and
   (d.) removing said residual fluorides and/or oxyfluorides from said surface by reacting said fluorides and/or oxyfluorides with a plasma-activated fluoride and/or oxyfluoride scavenger to provide adhesion for layers subsequently deposited on said surface.

14. The process of claim 13, further comprising the step, after said step of removing, depositing an overlying conductor layer.

15. The process of claim 13, wherein said step of removing uses an $NH_3$ plasma.

* * * * *